United States Patent [19]
Jeng et al.

[11] Patent Number: 5,877,556
[45] Date of Patent: Mar. 2, 1999

[54] STRUCTURE FOR COMPOSITE BUMPS

[75] Inventors: Jen-Huang Jeng; T. E. Hsieh, both of Hsinchu, Taiwan

[73] Assignee: Industrial Technology Research Institute, Hsinchu, Taiwan

[21] Appl. No.: 814,645

[22] Filed: Mar. 10, 1997

[30]     Foreign Application Priority Data

Dec. 13, 1996  [TW]   Taiwan ................................. 85115491

[51] Int. Cl.⁶ .......................... H01L 23/48; H01L 23/52; H01L 29/40
[52] U.S. Cl. .......................... 257/737; 257/738; 257/734
[58] Field of Search .................................. 257/737, 738, 257/734, 777, 778, 792; 438/613, 614

[56]            References Cited

U.S. PATENT DOCUMENTS 5,122,861   6/1992   Tamura et al. .......................... 257/680
5,130,779   7/1992   Agarwala et al. ....................... 257/737
5,393,697   2/1995   Chang et al. ........................... 438/613
5,431,328   7/1995   Chang et al. ........................... 228/106
5,477,087   12/1995  Kawakita et al. ....................... 257/737
5,545,589   8/1996   Tomura et al. .......................... 438/613

FOREIGN PATENT DOCUMENTS 60-65578   4/1985   Japan .................................... 257/737

*Primary Examiner*—Olik Chaudhuri
*Assistant Examiner*—Phat X. Cao

[57]            ABSTRACT

A composite bump structure comprising a first metal layer, a polymer bump formed on the first metal layer, and a second metal layer covering the polymer bump and the first metal layer. The first metal layer is formed above an input/output pad on an integrated circuit element. The polymer bump is positioned substantially off the center of the input/output pad. An open area next to the polymer bump above the input/output pad is established for probing test. The open area having the first and second metal layers and the input/output pad underneath can provide good testability.

4 Claims, 8 Drawing Sheets

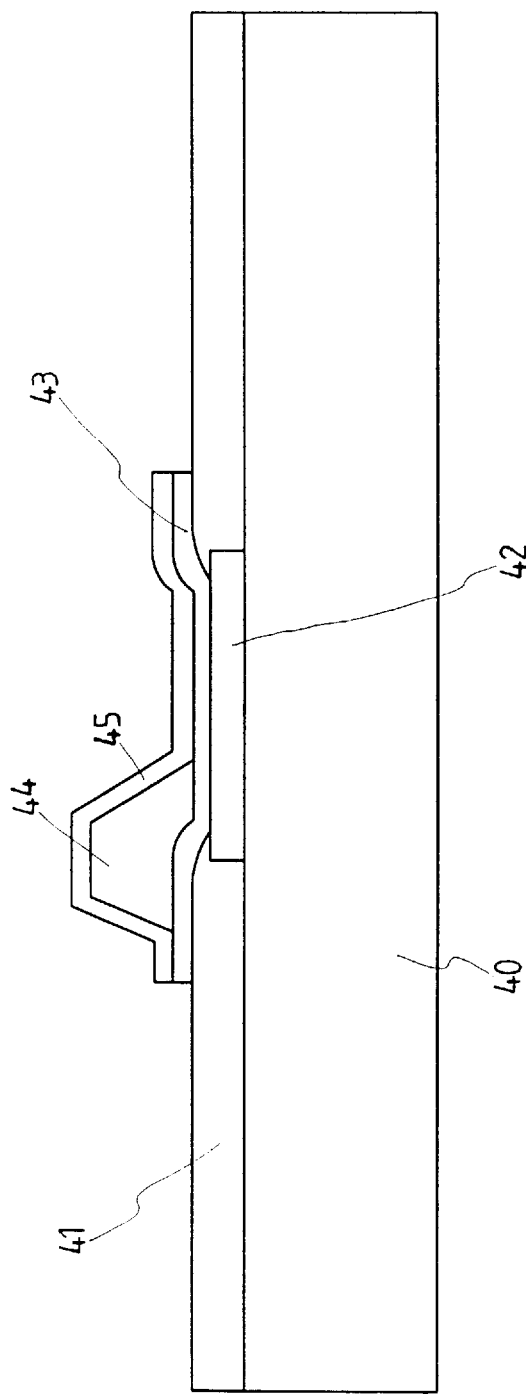
F I G. 6

STRUCTURE FOR COMPOSITE BUMPS

FIELD OF THE INVENTION

The present invention relates to the bonding of integrated circuit elements to the next level of integration and more specifically to the structure of metal/polymer composite bumps that provide the physical and electrical connection between the integrated circuit elements and the next level of integration.

BACKGROUND OF THE INVENTION

In the integrated circuit industry, the bonding and interconnecting of integrated circuit elements to the next level of integration is critical to the success of manufacturing highly dense integrated circuits. Bonding technologies such as tape automounted bonding (TAB), flip chip technology, and chip on glass (COG) have been developed to improve the interconnection and packaging of the integrated circuits. Conventionally, these technologies require that Au bumps be fabricated for the joining of the integrated circuit elements. The material Au provides good interconnections because it is not easily dioxized. The low hardness of Au also makes the interconnections more adaptable to stress and strain.

In semiconductor FABs, processes involving the use of Au have been generally disallowed in that the characteristic of a semiconductor device can be affected by Au. Therefore, the process of forming the Au bumps must be carefully separated and performed in a different manufactory. Both the possibility of contaminating the integrated circuits and the cost of fabrication are greatly increased.

In order to reduce the cost and simplify the process of forming the interconnecting bumps for an integrated circuits, the formation of composite bumps has been studied and disclosed in recent years. U.S. Pat. No. 5,393,697 issued to Shyh-Ming Chang et al. shows a composite structure and methods of forming the composite bump structure. U.S. Pat. No. 5,431,328 also issued to Shyh-Ming Chang et al. discloses a method of forming a bonded structure that includes solder joints and composite bumps. Both patents were assigned to the same assignee of the present invention. Other related prior arts include Japanese Laid Open Application Nos. 62927/91 and 84917/94.

FIG. 1 shows a composite bump structure disclosed in Japanese Laid Open Application No. 62927/91. The composite bump structure in FIG. 1 consists of a metal layer 12 and a polymer layer 11 formed above an input/output pad 10. The input/output pad 10 is formed on a silicon substrate 13 covered by a passivation layer 14. FIG. 2 shows an alternative composite bump of the prior art disclosed in U.S. Pat. No. 5,393,697. The composite bump comprises a first metal layer 23, a polymer layer 24 and a second metal layer 25. The bump is formed above an input/output pad 22 on a silicon substrate 20 that has a passivation layer 21 deposited thereon.

Although the composite bump comprising a polymer layer as shown in FIG. 1 or 2 offers some advantages for bonding and interconnecting the integrated circuit elements, its testability is an important issue that needs to be addressed. In general, integrated circuits are probed and tested before dies are cut from a wafer. The probing and testing are typically done on the interconnecting bumps. Due to the sharpness and hardness of a probing pin, the metal layer of the composite bump may be broken during the test. The testing result can therefore be inaccurate because the polymer layer below is highly insulating. One solution to the problem is increasing the thickness of the metal layer of the composite bump. The increased metal thickness hardens the composite bump. When composite bumps are connected in the next level of integration, they can not be easily adapted to accommodate the variation in the interface spacing. The quality of interconnection may therefore be degraded. That results in poor contact. The complexity and cost of manufacturing the bumps are also increased.

When polyimide (PI) is used for the polymer layer, the polymer layer in the composite bump is fabricated by an etching process. The top of the polymer layer is generally 10 $\mu$m narrower than the bottom on each side due to the etching undercut. Consequently, a large area is required for forming the composite bump. The large bump size makes it difficult to form composite bumps with a fine pitch for interconnecting high density integrated circuit elements that have a large number of input/output pads.

SUMMARY OF THE INVENTION

The present invention has been made to overcome the above-mentioned probing testability problem of composite bumps fabricated on an integrated circuit element. It is the primary object of this invention to provide a composite bump which can be formed as well as tested on an integrated circuit element. The composite bump of this invention comprises a first metal layer formed on the input/output pad of the integrated circuit element, two polymer bumps formed on the first metal layer in areas off the center of the input/output pad, and a second metal layer covering both the polymer bumps and the first metal layer.

According to the structure of the invention, the polymer bumps are positioned off the center of the input/output pad location where the probing test of the circuit is normally performed. An open area where both first and second metal layers and the input/output pad are underneath is established between the two composite bumps for probing test. The area does not have polymer layer underneath and can provide good probing accuracy when it is probed. The bump areas having polymer layers provide good interconnection to the next level of integration because of their low hardness and adaptability to both strain and stress.

Another object of this invention is to provide an array structure for manufacturing a plurality of composite bumps having a fine pitch. The polymer layer of the composite bump of this invention can be made connected with that of an adjacent composite bump. If the top and bottom metal layers of the adjacent bumps are isolated from each other, the function of the composite bumps are not affected. In other words, the polymer layer of an array of composite bumps can be made with a long structure in one direction. No etching of the polymer layer between bumps in the direction of long structure is needed. Composite bumps having a fine pitch can be formed without the etching undercut problem.

BRIEF DESCRIPTION OF THE DRAWINGS

FIG. 6 shows a cross-sectional view of another alternative embodiment of the composite bump of the present invention having one polymer bump covering approximately half of the area above the input/output pad.

DETAILED DESCRIPTION OF THE PREFERRED EMBODIMENTS

Figure 3:
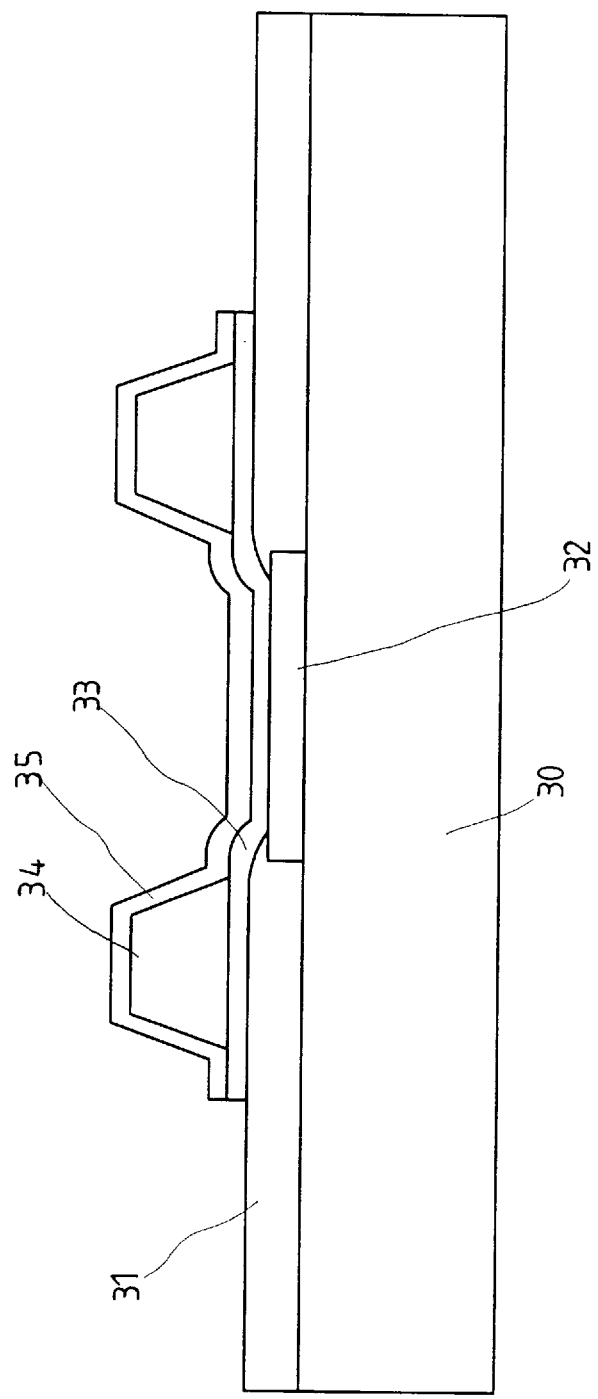
FIG. 3 shows a cross-sectional view of an embodiment of the composite bump of the present invention having two polymer bumps formed on the two sides of the input/output pad, said polymer bumps being substantially off the center of the input/output pad.

In the manufacture of highly dense integrated circuits, composite bumps are formed on an integrated circuit element for further interconnection. In general, the integrated circuit has been fabricated on a silicon substrate and covered by a passiviation layer. Input/output pads are provided for interconnection of the integrated circuit. FIG. 3 shows an embodiment of the composite bump of this invention formed on a silicon substrate 30. A passivation layer 31 and an aluminum input/output pad 32 have been formed on the substrate 30. The size of the input/output pad is approximately 70 mm square for input/output pads with 100 mm pitch.

A first metal layer 33 is formed above the aluminum pad 32 and the passivation layer 31 in the area around the input/output pad 32. A polymer layer is patterned to establish two polymer bumps 34 above the first metal layer 33. The two polymer bumps 34 are positioned off the area above the input/output pad 32 as shown in FIG. 3. A second metal layer 35 is then formed for covering the first metal layer 33 and the polymer bumps 34.

The first metal layer 33 is manufactured using a conventional photo-lithography technology. A conductive metal layer of approximately 0.5 $\mu$m is first deposited on the passivation layer 31 and the input/output pad 32. Material such as aluminum containing 1.5% of silicon may be used for the conductive metal layer. A patterned photoresist layer is used to cover the first metal layer around the input/output pads. The first metal layer is then etched using $H_3PO_4:CH_3COOH:HN_3:H_2O$ (16:1:1:0.875) to remove the metal in the exposed area. The photoresist is removed after etching.

The polymer layer may comprise polymer such as polyimide. Conventional techniques for patterning and etching a polyimide layer are used to form the polymer bumps 34 shown in FIG. 3. It is important that the two bumps 34 are positioned on the two sides of the input/output pads 32. The size of each polymer bump is approximately 35 $\mu$m square on the top and 50 $\mu$m square on the bottom after etching. The spacing between the two polymer bumps is about 50 $\mu$m.

The fabrication of the second metal layer 35 is similar to that of the first metal layer 33. The thickness of the second metal layer 35 may be thicker than the first metal layer 33 dependent on the design of the composite bump. The preferred thickness in this embodiment is at least 0.5 $\mu$m. After the formation of the second metal layer 35, the composite bump structure of this invention includes an open area for probing test established between the two bumps 34 and above the input/output pad 32 and as shown in FIG. 3. The area below the open area comprises the first and second metal layers as well as the input/output pad 32.

An important aspect of this invention is the testability of the composite bump structure. The probing pin of a prober is typically hard and sharp so that good contact with integrated circuit elements and proper signal transmission are achievable. Because probing test of an integrated circuit element is usually done after the formation of the bonding bump, it is important that the composite bump structure can stand the test of a conventional prober used in a semiconductor FAB. The hardness and sharpness of the probing pin may break through the top metal layer of a conventional composite bump if it is not thick enough. The result of the test would be inaccurate and unpredictable under this circumstance because the polymer layer underneath is highly insulating.

Figure 1:
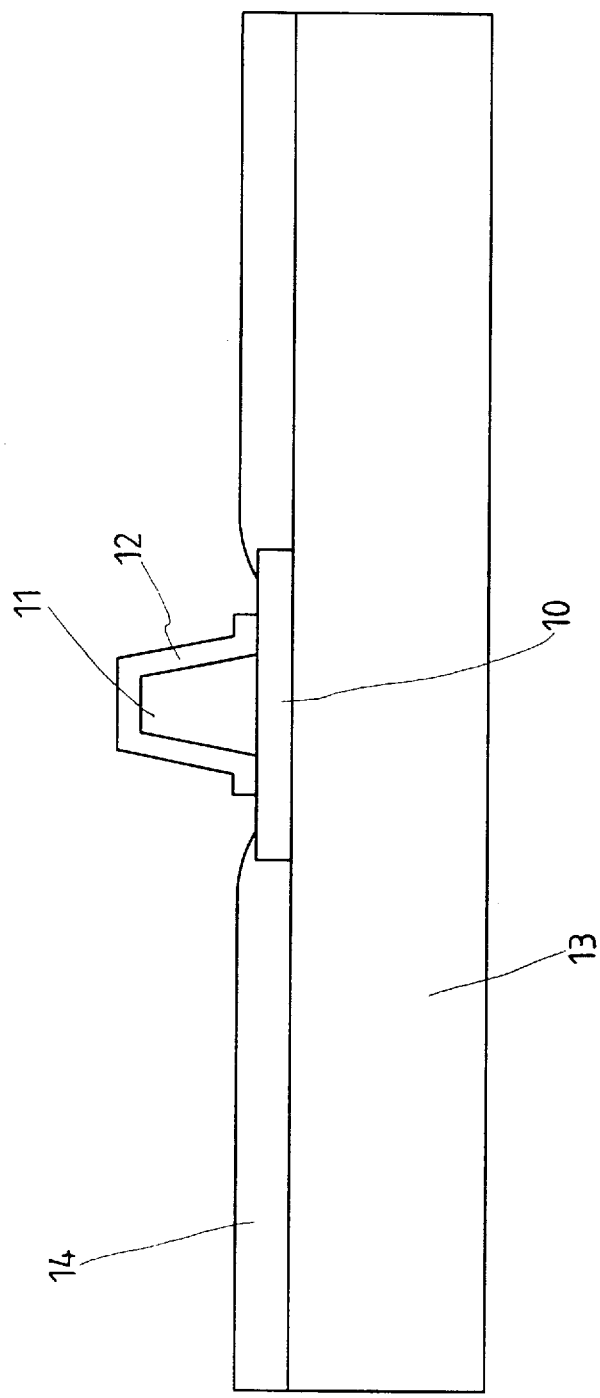
FIG. 1 shows a cross-sectional view of a composite bump of the prior art.
Figure 2:
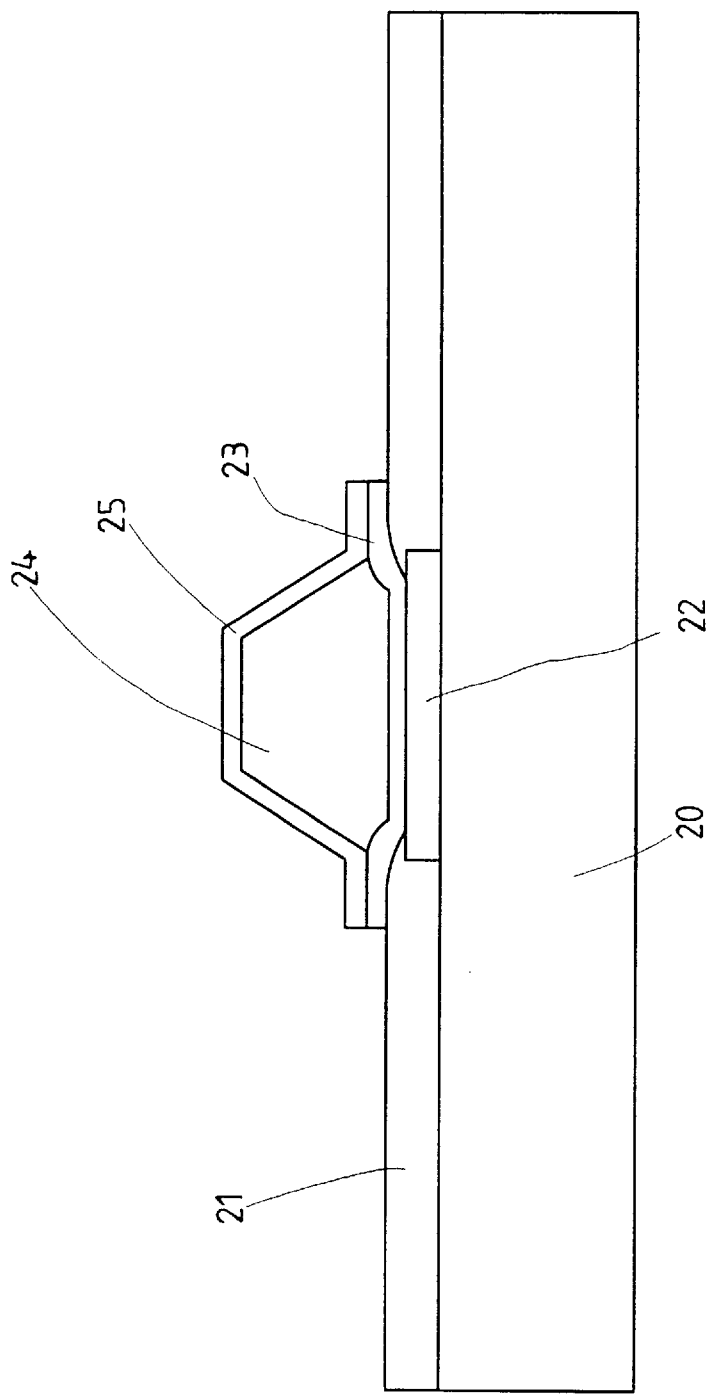
FIG. 2 shows a cross-sectional view of another composite bump of the prior art.

In the conventional structure as shown in FIGS. 1 and 2, the thickness of the top metal layer can be increased to avoid being broken. However, the increased metal layer thickness would also harden the composite bump. The hardness makes the bumps less adaptable to the variation in the interface spacing when interconnected with other device structures. The quality of interconnection at the next level of integration may be degraded. The cost and complexity of making the composite bump are also increased.

Figure 4:
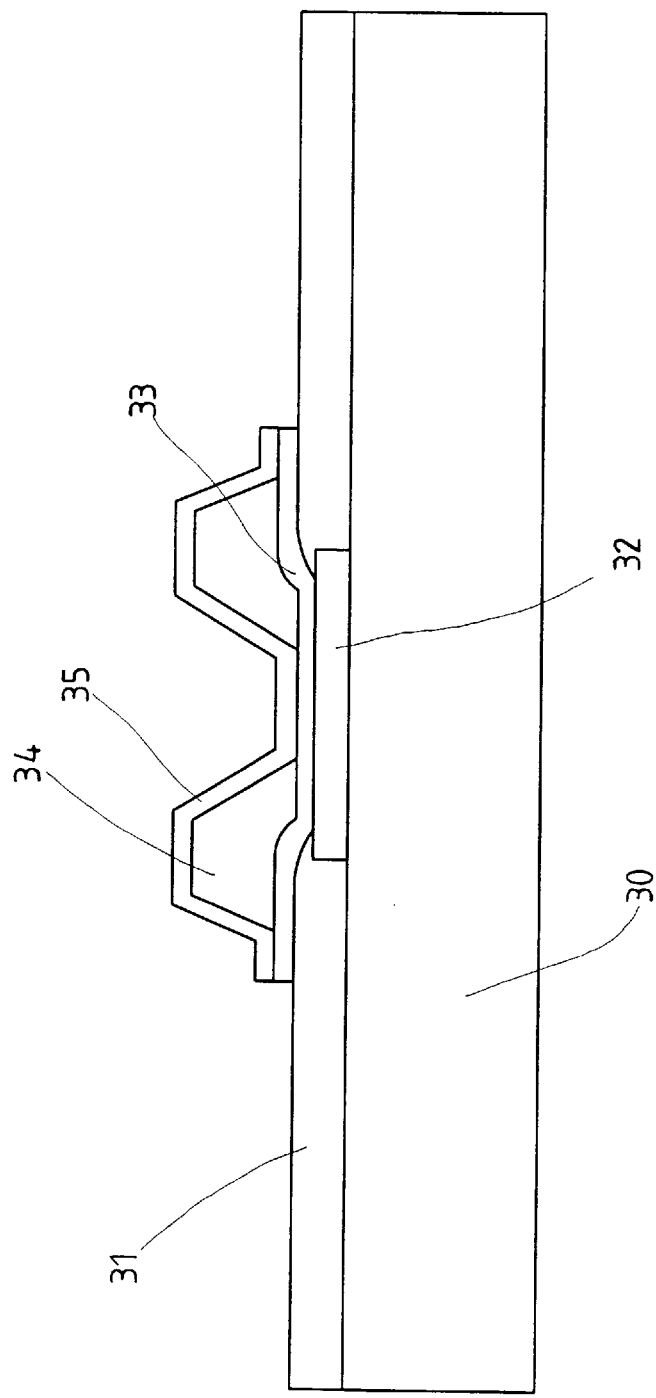
FIG. 4 shows a cross-sectional view of an alternative embodiment of the composite bump of the present invention having two polymer bumps formed on the two sides of the input/output pad, said polymer bumps overlapping part of the input/output pad and leaving an open area for probing test.

The composite bump structure of the present invention comprises an open area above the input/output pad 32. The area is used for probing test. The testing result is very accurate and reliable because the underneath layers in the area are the first and second metal layers and the input/output pad 32. They are highly conductive. It has been found that with a thickness of approximately 0.8 $\mu$m in the second metal layer, the probing test on the composite bumps of this invention has extremely low failure rate. In some cases, there are only limited areas available outside the input/output pad 32 for forming the composite bump. The embodiment of FIG. 3 may be modified as that shown in FIG. 4. The two polymer bumps 34 overlap part of the input/output pad 32 but leave an open area above the input/output pad 32 for probing test.

Figure 5:
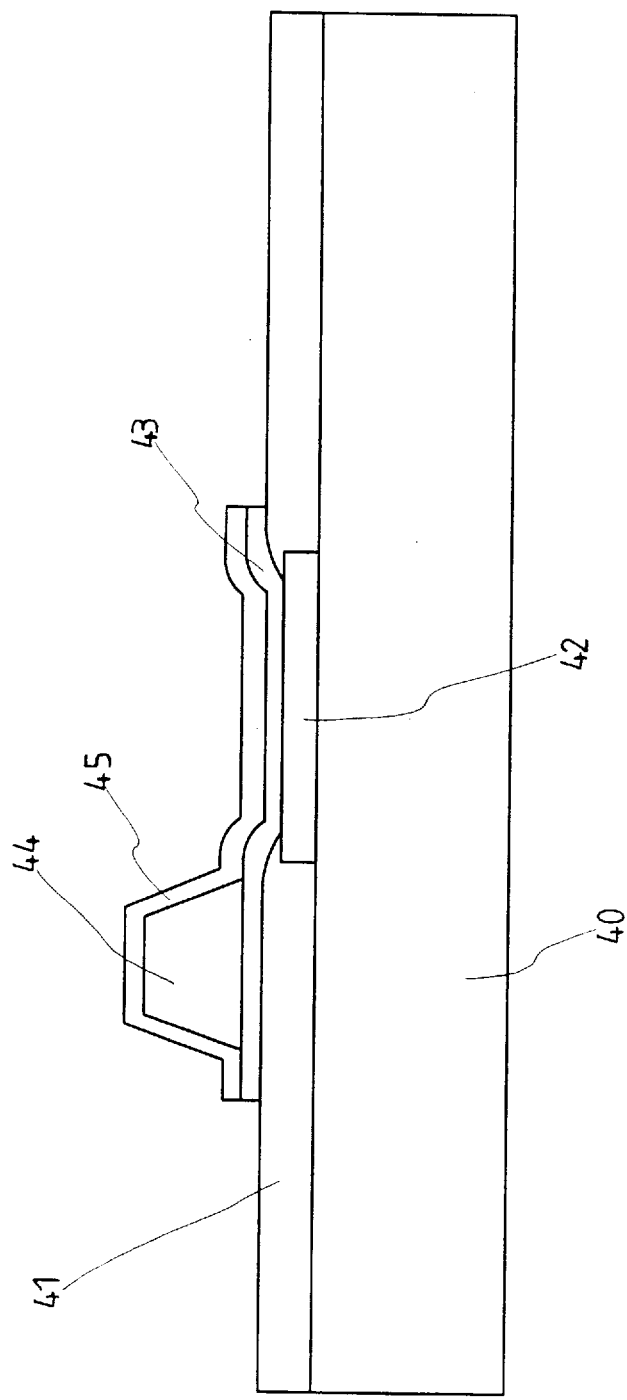
FIG. 5 shows a cross-sectional view of an embodiment of the composite bump of the present invention having one polymer bump formed substantially off the center of the input/output pad.

FIG. 5 shows an alternative embodiment of the composite bump structure of this invention formed on a silicon substrate 40. Above the silicon substrate 40 is an input/output pad 42 and a passivation layer 41. The composite bump structure comprises a first metal layer 43, a polymer bump 44 and a second metal layer 45. The fabrication of this embodiment is similar to that of the embodiment described previously except that only one polymer bump 44 is formed. The polymer bump 44 is positioned substantially off the center of the area above the input/output pad 42. A probing test area having the first and second metal layers underneath is thus established above the input/output pad 42. For the same reason described in the first embodiment, the area can be probed and tested for an integrated circuit element with good accuracy and reliability. Therefore, the composite bump structure of the alternative embodiment also has excellent probing testability.

It should be noted that this invention is to provide a composite bump structure in which the polymer layer is off the center of the input/output pad leaving an open area above the input/output pad for probing test. The structure as shown in FIG. 3 provides more contact area for the interconnection in the next level of integration such as a COG process. The contact resistance is, therefore, reduced due to the increase in the top area of the composite bump.

In the composite bump structure of FIG. 5, the polymer layer is positioned off the input/output area almost completely. It gives the composite bump better top flatness. However, more area on the substrate outside the input/output pad is required for fabricating the bump structure. If it is necessary to avoid using too much area outside the input/output pad, the structure as shown in FIG. 6 can be used. The bump structure is almost identical to that shown in FIG. 5 except that one side of the polymer layer is positioned closer to the center of the input/output pad leaving a smaller open area above the input/output pad for probing test.

The polymer layer in a conventional composite bump structure or the composite bump structures of this invention described above generally have a smaller top and a wider base as shown in FIG. 1–6 due to the etching of the polyimide material. The top area is at least 10 $\mu$m narrower than the bottom area on each side. When the polymer layer is designed and patterned, it is necessary to reserve enough area to compensate for the undercut. Therefore, the spacing between the polymer layers of two adjacent composite bumps has to be at least 30 $\mu$m that makes it difficult to form a number of composite bumps with a fine pitch.

Figure 7:
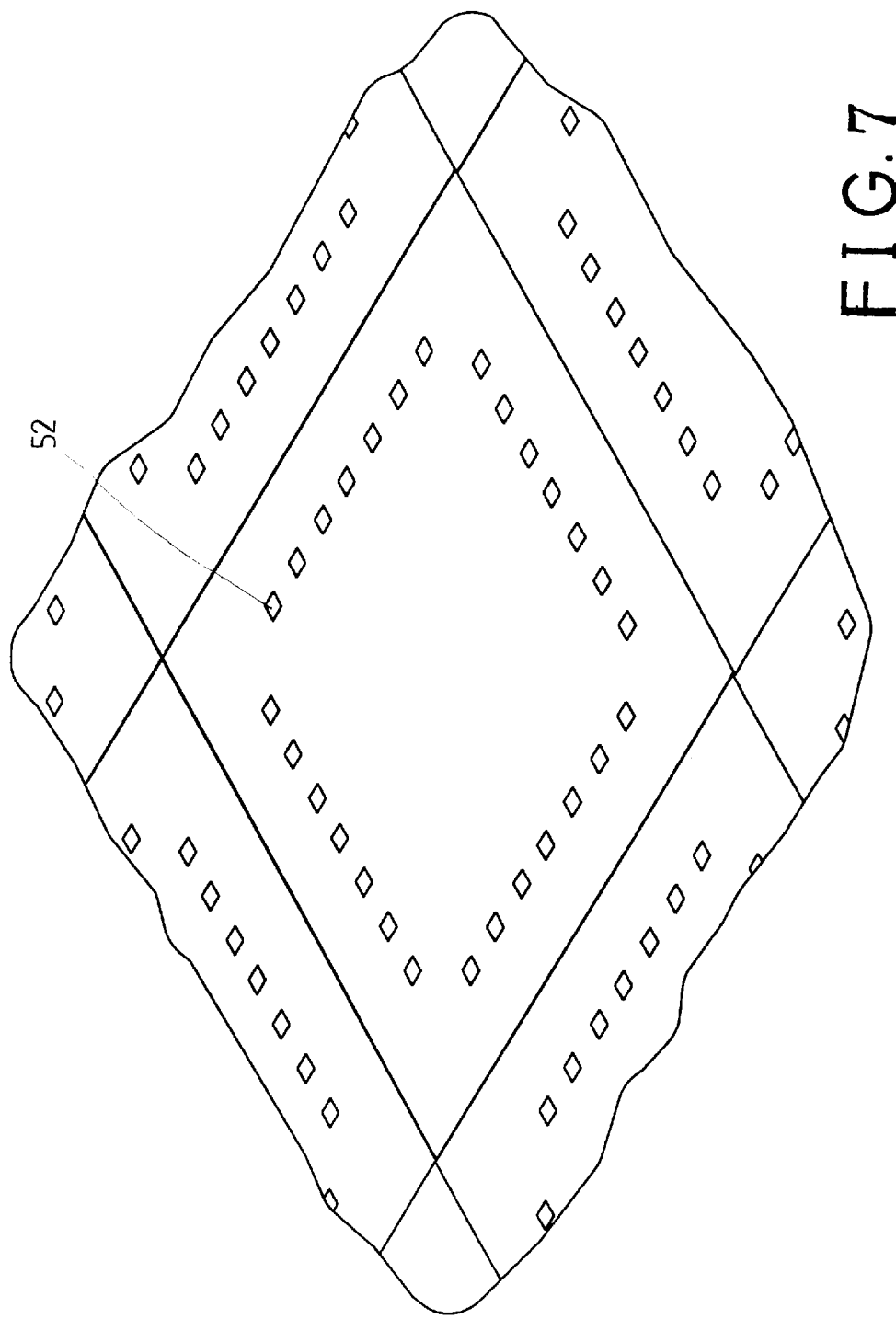
FIG. 7 shows a perspective view of a wafer having arrays of input/output pads for integrated circuits before the composite bumps are fabricated.
Figure 8:
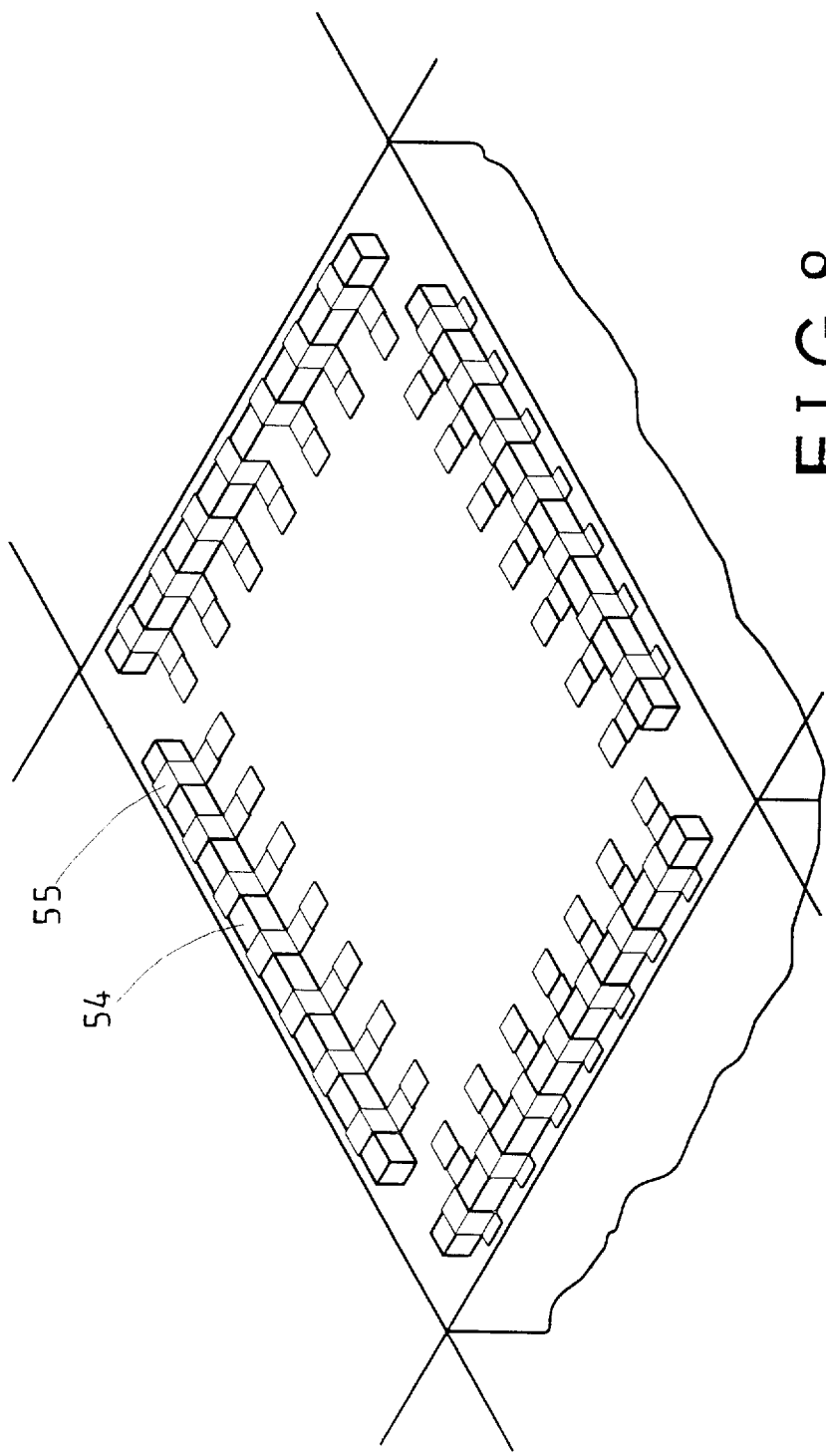
FIG. 8 illustrates a perspective view of a wafer after arrays of composite bumps having structures of FIG. 5 are fabricated by connecting polymer bumps into a long polymer bump structure.

FIG. 7 shows a perspective view of a wafer having arrays of input/output pads for integrated circuits-before the composite bumps are fabricated. In order to form composite bumps with a fine pitch for dense input/output pads, the present invention provides an array structure for composite bumps as shown in FIG. 8. The arrangement as illustrated in FIG. 8 makes it possible in forming composite bumps with a fine pitch. Because the polymer layer is formed by highly insulating polyimide material, adjacent composite bumps can be insulated from each other even if the polymer layer is connected as long as the first and second metal layers are well separated between adjacent bumps. Therefore, the present invention provides a long structure for the polymer layer when more than one composite bump with a fine pitch are manufactured. The first and second metal layers are formed as it has been described earlier. The polymer layer is formed without etching the polyimide material between adjacent composite bumps as shown in FIG. 8.

As can be seen from FIG. 8, the spacing between two adjacent composite bumps can be very small because the metal layers need only approximately 1 $\mu$m undercut between two composite bumps. During the process of fabrication, the patterning of the polymer layer is such that a long polymer structure along the direction of the array bumps is unetched. Therefore, composite bumps can be manufactured with a very fine pitch because only a small space is required between adjacent bumps. Although FIG. 7 only illustrates arrays of composite bumps having the structure of FIG. 5, arrays of composite bumps of FIG. 3, FIG. 4 or FIG. 6 can also be fabricated with similar approach and arrangement to minimize the pitch between bumps.

For manufacturing liquid crystal displays (LCD), chip on glass technology has become the most competitive technology for bonding and packaging LCD driver integrated circuits. By using an anisotropic conductive film as the bonding material, the composite bump structures disclosed above have demonstrated excellent and reliable contact quality for bonding an integrated circuit bare chip to an aluminum or indium tin oxide pad on a glass substrate. Ultra-violet resin may also be used for bonding the composite bump structures.

What is claimed is:

1. A composite bump structure of an integrated circuit element, comprising:
    a first composite bump having:
        an input/output pad formed on the integrated circuit element, said integrated circuit element being covered by a passivation layer outside said input/output pad;
        a first metal layer formed above said input/output pad, said metal layer extending substantially outward for covering portions of said passivation layer on first and second sides of said input/output pad;
        a first polymer bump formed on said first metal layer above said passivation layer on said first side of said input/output pad;
        a second polymer bump formed on said first metal layer above said passivation layer on said second side of said input/output pad; and
        a second metal layer covering said first and second polymer bumps and said first metal layer;
        wherein an open area above said input/output pad between said first and second polymer bumps is established for probing test, said open area having said first and second metal layers and said input/output pad underneath;
    and at least a second composite bump having a structure identical to said first composite bump, said first and second composite bumps being formed in parallel, said first polymer bump of each of the two composite bumps connecting each other and forming a first long polymer bump structure, and said second polymer bump of each of the two composite bumps connecting each other and forming a second long polymer bump structure.

2. The composite bump structure of an integrated circuit element according to claim 1, wherein said first polymer bump further extends towards the center of said input/output and overlaps a portion of said input/output pad, said second polymer bump further extends towards the center of said input/output and overlaps a portion of said input/output pad, and an open area above said input/output pad between said first and second polymer bumps is established for probing test.

3. A composite bump structure of an integrated circuit element, comprising:
    a first composite bump having:
        an input/output pad formed on an integrated circuit element, said integrated circuit element being covered by a passivation layer outside said input/output pad;
        a first metal layer formed above said input/output pad, said metal layer extending outward for covering portions of said passivation layer on first and second sides of said input/output pad;
        a polymer bump formed on said first metal layer above said passivation layer, said polymer bump being positioned substantially off the center of said input/output pad; and
        a second metal layer covering said polymer bump and said first metal layer;
        wherein an open area above said input/output pad next to said polymer bump is established for probing test, said open area having said first and second metal layers and said input/output pad underneath;
    and at least a second composite bump having a structure identical to said first composite bump, said first and second composite bumps being formed in parallel, said polymer bump of each of the two composite bumps connecting each other and forming a long polymer bump structure.

4. The composite bump structure of an integrated circuit element according to claim 3, wherein said polymer bump is formed on said first metal layer, said polymer bump being positioned substantially off the center of said input/output pad and overlapping approximately half of said input/output pad.

* * * * *